United States Patent
Huang

(10) Patent No.: US 10,761,175 B2
(45) Date of Patent: *Sep. 1, 2020

(54) FIXTURE DE-EMBEDDING USING CALIBRATION STRUCTURES WITH OPEN AND SHORT TERMINATIONS

(71) Applicant: ATAITEC CORPORATION, San Jose, CA (US)

(72) Inventor: Ching-Chao Huang, San Jose, CA (US)

(73) Assignee: ATAITEC CORPORATION, San Jose, CA (US)

(*) Notice: Subject to any disclaimer, the term of this patent is extended or adjusted under 35 U.S.C. 154(b) by 318 days.

This patent is subject to a terminal disclaimer.

(21) Appl. No.: 15/754,417

(22) PCT Filed: Sep. 7, 2016

(86) PCT No.: PCT/US2016/050574
§ 371 (c)(1),
(2) Date: Feb. 22, 2018

(87) PCT Pub. No.: WO2017/044498
PCT Pub. Date: Mar. 16, 2017

(65) Prior Publication Data
US 2018/0238990 A1 Aug. 23, 2018

Related U.S. Application Data

(60) Provisional application No. 62/216,537, filed on Sep. 10, 2015.

(51) Int. Cl.
*G01R 35/00* (2006.01)
*G01R 27/32* (2006.01)

(52) U.S. Cl.
CPC ........... *G01R 35/005* (2013.01); *G01R 27/32* (2013.01)

(58) Field of Classification Search
CPC ...... G01R 27/32; G01R 35/005; G01R 35/00; G01R 27/28; G01R 1/28
See application file for complete search history.

(56) References Cited

U.S. PATENT DOCUMENTS

| 6,943,563 B2 | 9/2005 | Martens |
| 7,019,535 B2 | 3/2006 | Adamian |

(Continued)

FOREIGN PATENT DOCUMENTS

WO 2017044498 A1 3/2017

OTHER PUBLICATIONS

Huang, Ching-Chao, "In-Situ De-embedding," 4 pages, Electronic Design Innovation Conference (EDI CON), Beijing, China, Apr. 2016.

(Continued)

*Primary Examiner* — Jermele M Hollington
*Assistant Examiner* — Suresh K Rajaputra
(74) *Attorney, Agent, or Firm* — Procopio, Cory, Hargreaves & Savitch LLP

(57) ABSTRACT

The present disclosure involves method and apparatus for de-embedding test fixture to extract the electrical behavior of device under test. A calibration board with both "1× open" and "1× short" test structures is fabricated and measured by equipment such as vector network analyzer that produces S parameters. The S parameters of "1× open" and "1× short", with or without correction factors, are combined to produce the S parameters of equivalent "2× thru" test structure. The S parameters of equivalent "2× thru" are used subsequently to de-embed the test fixture. This present disclosure gives a simpler and more accurate method to create the S parameters of "2× thru" for de-embedding.

20 Claims, 8 Drawing Sheets

(56) References Cited

U.S. PATENT DOCUMENTS

| | | |
|---|---|---|
| 7,157,918 B2 | 1/2007 | Adamian |
| 9,086,376 B1 | 7/2015 | Dunsmore et al. |
| 9,797,977 B2 * | 10/2017 | Huang .................. G01R 27/32 |
| 2003/0132759 A1 | 7/2003 | Tsironis |
| 2004/0051538 A1 | 3/2004 | Adamian |
| 2004/0251922 A1 | 12/2004 | Martens et al. |
| 2005/0093554 A1 | 5/2005 | Wang et al. |
| 2005/0110502 A1 | 5/2005 | Wang et al. |
| 2005/0240361 A1 | 10/2005 | Loyer |
| 2008/0258738 A1 | 10/2008 | Martens et al. |
| 2011/0298476 A1 | 12/2011 | Degerstrom et al. |
| 2014/0180604 A1 | 6/2014 | Corcos et al. |
| 2015/0198523 A1 | 7/2015 | Dunsmore et al. |

OTHER PUBLICATIONS

Notification of Transmittal of the International Search Report and the Written Opinion for International Application No. PCT/US16/50574, 12 pages, dated Jan. 27, 2017. International Searching Authority/US, Alexandria VA US.

\* cited by examiner

OPEN    SHORT

OPEN

SHORT

FIXTURE DE-EMBEDDING USING CALIBRATION STRUCTURES WITH OPEN AND SHORT TERMINATIONS

CROSS-REFERENCE TO RELATED APPLICATIONS

This application is a U.S. National Stage entry of PCT Application No: PCT/US2016/050574 filed Sep. 7, 2016, which claims priority to U.S. Provisional Patent Application No. 62/216,537, filed Sep. 10, 2015, the contents of which are incorporated herein by reference.

BACKGROUND

Field

The present disclosure relates in general to the method and apparatus for de-embedding test fixtures to measure a device under test.

Description of the Related Art

Equipment such as Vector Network Analyzer (VNA) is used to measure the electrical behavior, in the form of scattering parameters (i.e., S parameters), of a device under test (DUT). The DUT can be a component such as a resistor, capacitor, or integrated circuit (IC), or can also be a cable or other electrical assembly. The DUT is usually mounted on or connected to a test fixture, such as printed circuit board (PCB) with coaxial connectors, so the entire assembly can be more conveniently connected to VNA through co-axial cables. The test fixture must be de-embedded in order to obtain data for the DUT itself.

Electrical behavior is expressed in scattering parameters or S parameters, which is measured by the VNA, software executed by the VNA, or other equipment configured to generate S parameters, depending on the desired implementation. Alternatively, S parameters can be stored in a touchstone file for analysis by a computer, server or other desired apparatus.

U.S. Pat. Nos. 7,019,535 and 7,157,918 use a "2× thru" structure for calibration. A "2× thru" structure corresponds to the test fixture in front of DUT cascaded with the mirror image of the same test fixture. One half of this "2× thru" structure is used to de-embed the test fixture. This one half of the 2× thru structure can also be further refined to de-embed the test fixture, depending on the desired implementation, as described, for example in "In-Situ De-embedding," by Ching-Chao Huang, Electronic Design Innovation Conference (EDI CON), Beijing, China, April 2016.

U.S. Pat. No. 9,086,376 uses a "1× open" or "1× short" structure for calibration. The "1× open" structure resembles the test fixture in front of DUT, which may include coaxial connectors and PCB, but with one end close to DUT being left open (or floating). The "1× short" structure resembles the test fixture in front of DUT, which may include coaxial connectors and PCB, but with one end close to DUT being shorted to ground. Through time-gating, U.S. Pat. No. 9,086,376 uses "1× open" or "1× short" to reconstruct one half of "2× thru" for de-embedding. Time-gating is known to be prone to errors, however.

SUMMARY

Example implementations described herein utilize both "1× open" and "1× short" structures for calibration. The example implementations described herein combines the S parameters of "1× open" and "1× short", with or without correction factors, to reconstruct the S parameters of "2× thru". In example implementations, no time-gating is needed for the procedures.

In one aspect of the present disclosure, a calibration board with both "1× open" and "1× short" structures is used. The S parameters of "2× thru" ($S_{thru}$) is written as $$(S_{thru}) = \begin{pmatrix} S_{11} & S_{12} \\ S_{21} & S_{22} \end{pmatrix}$$

where the subscript "1" corresponds to Ports 1 to N on the input side and the subscript "2" corresponds to Ports N+1 to 2*N on the output side of "2× thru" structure. In other words, $S_{11}$, $S_{12}$, $S_{21}$ and $S_{22}$ are all N×N matrices. Due to reciprocity, $S_{21}=S_{12}$. For a symmetric "2× thru", $S_{22}=S_{11}$. So, $$(S_{thru}) = \begin{pmatrix} S_{11} & S_{12} \\ S_{12} & S_{11} \end{pmatrix}$$

When an infinite plane of perfect magnetic conductor (PMC) is placed going through the center of "2× thru", the S parameters of one half of "2× thru" ($S_{PMC}$) can be written as $$S_{PMC}=S_{11}+S_{12}$$

When an infinite plane of perfect electric conductor (PEC) is placed going through the center of "2× thru", the S parameters of one half of "2× thru" ($S_{PEC}$) can be written as $$S_{PEC}=S_{11}-S_{12}$$

In another aspect of the present disclosure, the S parameters of "1× open" ($S_{open}$), with or without correction factor $\Delta_{open}$, is used to approximate $S_{PMC}$ and the S parameters of "1× short" ($S_{short}$), with or without correction factor $\Delta_{short}$, is used to approximate $S_{PEC}$:

$$S_{PMC} \approx S_{open}+\Delta_{open}$$

$$S_{PEC} \approx S_{short}+\Delta_{short}$$

In another aspect of the present disclosure, the S parameters of "2× thru" ($S_{thru}$) is approximated by combining the S parameters of "1× open" ($S_{open}$), with or without correction factor $\Delta_{open}$, and "1× short" ($S_{short}$), with or without correction factor $\Delta_{short}$, through the following operation:

$$S_{11} \approx \frac{1}{2}(S_{open}+S_{short}+\Delta_{open}+\Delta_{short})$$

$$S_{12} \approx \frac{1}{2}(S_{open}-S_{short}+\Delta_{open}-\Delta_{short})$$

$$(S_{thru}) = \begin{pmatrix} S_{11} & S_{12} \\ S_{12} & S_{11} \end{pmatrix}$$

In another aspect of the present disclosure, the correction factors $\Delta_{open}$ and $\Delta_{short}$ are pre-characterized by a field solver or other means that compares the difference between "1× open" and PMC boundary condition and the difference between "1× short" and PEC boundary condition, respectively.

The creation of the above S parameters of "2× thru" ($S_{thru}$) can be implemented in either stand-alone software or hardware such as Vector Network Analyzer. The S parameters of "2× thru" ($S_{thru}$) are used subsequently for further data processing to de-embed the test fixture.

The advantages of the example implementations of the present disclosure are that it is both simple and accurate and it is applicable to arbitrary number of ports. It is accurate because the calculations for the S parameters at 2× thru are performed at each frequency directly whereas U.S. Pat. No. 9,086,376 uses time-gating and is prone to errors from waveform estimation and time-to-frequency or frequency-to-time conversion. The correction factors $\Delta_{open}$ and $\Delta_{short}$ can be introduced to compensate the deviation of actual field distribution for "1× open" and "1× short" from the boundary conditions of PMC and PEC. While the calculation of ($S_{PMC}$) in the related art requires that the normal electric field be zero on the entire PMC plane, "1× open" only meets this condition at the end surface of signal conductor(s). Similarly, the calculation of ($S_{PEC}$) in the related art requires that the tangential electric field is zero on the entire PEC plane, but "1× short" only meets this condition at the end surface of signal conductor(s). Such errors are usually small because the discrepancy of field distribution is localized to the areas surrounding the end surface of "1× open" and "1× short" structures. When necessary, the correction factors $\Delta_{open}$ and $\Delta_{short}$ can be pre-characterized using a field solver or other means.

Aspects of the present disclosure can include a non-transitory computer readable medium, storing instructions for executing a process. The instructions can include determining first S parameters of a device under test (DUT) connected to a test fixture; determining second S parameters of a 1× open test structure; determining third S parameters of a 1× short test structure; constructing fourth S parameters of a 2× thru test structure from the second S parameters and the third S parameters; and de-embedding the test fixture based on the first S parameters and the fourth S parameters to generate fifth S parameters of the DUT.

Aspects of the present disclosure can include a method which can include determining first S parameters of a device under test (DUT) connected to a test fixture; determining second S parameters of a 1× open test structure; determining third S parameters of a 1× short test structure; constructing fourth S parameters of a 2× thru test structure from the second S parameters and the third S parameters; and de-embedding the test fixture based on the first S parameters and the fourth S parameters to generate fifth S parameters of the DUT.

Aspects of the present disclosure can include an apparatus, which can involve a processor, configured to determine first S parameters of a device under test (DUT) connected to a test fixture; determine second S parameters of a 1× open test structure; determine third S parameters of a 1× short test structure; construct fourth S parameters of a 2× thru test structure from the second S parameters and the third S parameters; and de-embed the test fixture based on the first S parameters and the fourth S parameters to generate fifth S parameters of the DUT.

Aspects of the present disclosure further include a system for de-embedding the test fixture and extracting the S parameters of device under test (DUT) which can involve a DUT and test fixture assembly connected to a first apparatus configured to produce first S parameters; a calibration apparatus (e.g., a board) comprising a 1× open test structure and a 1× short test structure; a second apparatus configured to combine second S parameters of the 1× open test structure and third S parameters of the 1× short test structure to construct fourth S parameters of a 2× thru test structure; and an extractor configured to de-embed the test fixture by using the fourth S parameters to generate fifth S parameters of the DUT.

In such system implementations, the second apparatus is configured to construct the fourth S parameters ($S_{thru}$) from the combination of the second S parameters ($S_{open}$) and the third S parameters ($S_{short}$) in accordance with:

$$S_{11} \approx \frac{1}{2}(S_{open} + S_{short})$$

$$S_{12} \approx \frac{1}{2}(S_{open} - S_{short})$$

$$(S_{thru}) = \begin{pmatrix} S_{11} & S_{12} \\ S_{12} & S_{11} \end{pmatrix}$$

wherein the subscript "1" corresponds to a vector of port indices associated with a plurality of external ports of the test fixture.

In another example of the system implementation, the second apparatus is configured to construct the fourth S parameters ($S_{thru}$) from the second S parameters ($S_{open}$) and the third S parameters ($S_{short}$) is performed in accordance with:

$$S_{11} \approx \frac{1}{2}(S_{open} + S_{short} + \Delta_{open} + \Delta_{short})$$

$$S_{12} \approx \frac{1}{2}(S_{open} - S_{short} + \Delta_{open} - \Delta_{short})$$

and $$(S_{thru}) = \begin{pmatrix} S_{11} & S_{12} \\ S_{12} & S_{11} \end{pmatrix}$$

wherein the subscript "1" corresponds to a vector of port indices associated with the plurality of external ports of test fixture;

wherein $\Delta_{open}$ is a first correction factor for the second S parameters, and $\Delta_{short}$ is a second correction factor for the third S parameters. The first correction factor $\Delta_{open}$ can be based on a difference between "1× open" and perfect magnetic conductor (PMC) boundary condition and wherein the second correction factor $\Delta_{short}$ can be based on a difference between "1× short" and perfect electric conductor (PEC) boundary condition, respectively.

In such a system, the first apparatus is a vector network analyzer (VNA), and wherein the second apparatus is one of a computer, a server, and the VNA. The 1× open test structure and the 1× short test structure may also be manufactured with substantially similar materials and a substantially similar layout pattern as the test fixture. The extractor may also be in the form of software or circuitry on the computer, the server, or the VNA, depending on the desired implementation.

It is to be understood that both the foregoing and the following descriptions are exemplary and explanatory only and are not intended to limit the claimed invention or application thereof in any manner whatsoever.

BRIEF DESCRIPTION OF THE DRAWINGS

The accompanying drawings, which are incorporated in and constitute a part of this specification illustrate example implementations of the present disclosure, and, together with the description, serve to explain and illustrate principles of the inventive technique. Specifically.

DETAILED DESCRIPTION

Figure 1:
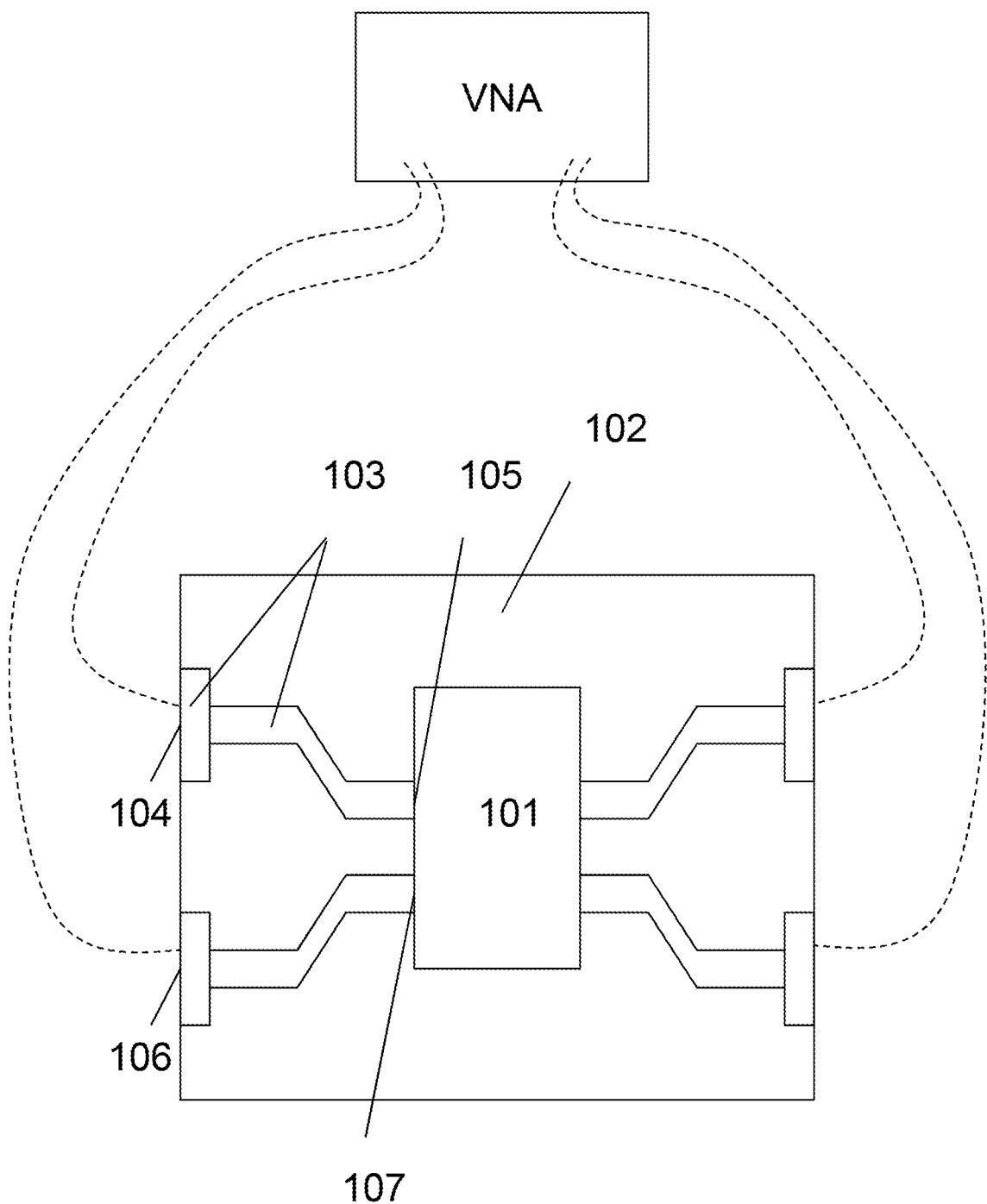
FIG. 1 shows an example of a device under test (DUT) mounted on a test board which is connected through cables to vector network analyzer (VNA), in accordance with an example implementation.

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application. Selection can be conducted by a user through a user interface or other input means, or can be implemented through a desired algorithm. Example implementations as described herein can be utilized either singularly or in combination and the functionality of the example implementations can be implemented through any means according to the desired implementations.

FIG. 1 shows an example of a device under test (DUT) 101 mounted on a test board 102 which is connected through cables to vector network analyzer (VNA), in accordance with an example implementation. The test fixture 103 in front of DUT 101 is to be de-embedded. The interfaces 104 and 106 between cables and test fixture are considered "external" ports, and the interfaces 105 and 107 between test fixture and DUT 101 are considered "internal" ports.

In example implementations, de-embedding is conducted to extract the electrical performance of the DUT, and measurements are processed directly from the VNA cables, which is attached to a connector element. Due to the use of a connector, the DUT is measured indirectly as it is connected to the connector and the test fixture 103. The test fixture can be in the form of a PCB or other configurations, depending on the DUT and the desired implementation.

Thus, in example implementations there can be connectors (e.g. coaxial) and cables (e.g. coaxial) that intervene between the DUT and VNA, which can contaminate the measurements coming from the DUT. The de-embedding process involves removing such contamination effects from the fixture to extract the actual DUT response, which can be done through the use of a reference measurement or a calibration mechanism.

In example implementations, test coupons are utilized to remove the effect from the intervening components. If, for example, the test coupon utilized is identical to the test fixture 103, then the effect of the fixture can be removed through many methods in the related art.

Figure 2:
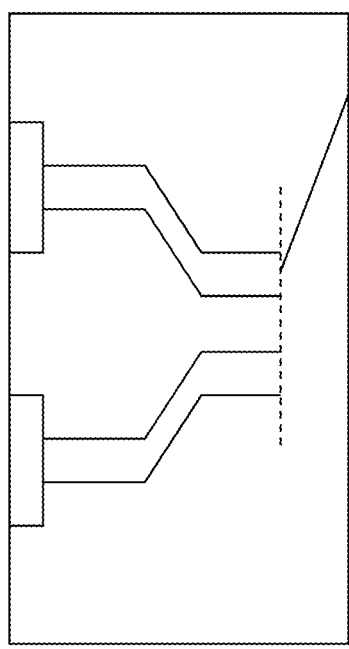
FIG. 2 illustrates the "1× open" and "1× short" test structures, in accordance with an example implementation.
Figure 2:
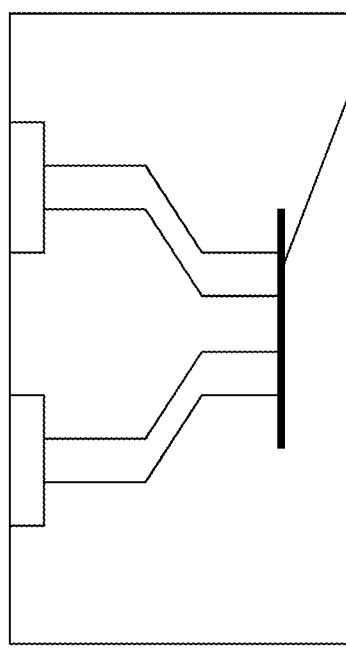

FIG. 2 illustrates the "1× open" and "1× short" test structures, in accordance with an example implementation. Specifically, FIG. 2 shows the "1× open" and "1× short" test structures that resemble the test fixture 103, but with the internal ports 201 and 202 being open and short, respectively. The 1× open and 1× short test structures are two test coupons wherein one port is left as an open circuit, and one port is left as a short circuit to emulate a "2× thru" test coupon. Such test coupons can be fabricated on a PCB, in accordance with the desired implementation. For example, the 1× open structure can be in the form of a trace and a connector or coaxial connector, wherein the trace responds to the leading trace going into the DUT with an open circuit at one end. The 1× short structure can be similar, with a short at the end of the structure. The two test coupons can be used for reference for de-embedding, whereupon the de-embedding S parameters can be extracted.

Figure 3:
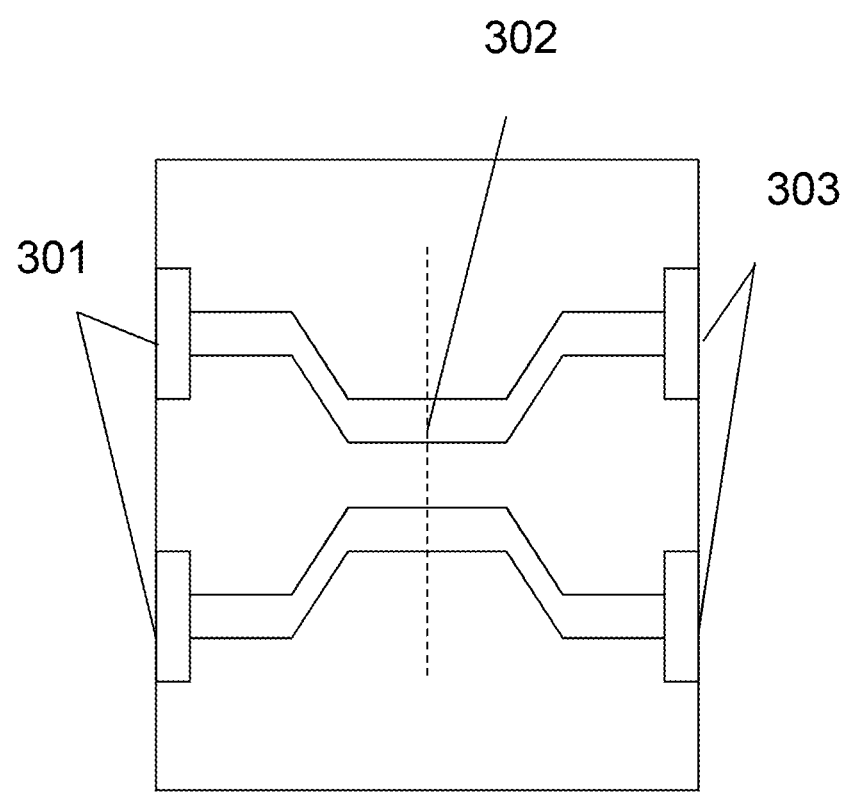
FIG. 3 illustrates an equivalent "2× thru" test structure that resembles the test fixture being placed back to back, in accordance with an example implementation.

FIG. 3 illustrates an equivalent "2× thru" test structure that resembles the test fixture 103 being placed back to back, in accordance with an example implementation. Through the use of the 1× open and 1× short test coupons, an equivalent 2× thru structure can be formed as a reference for the embedding.

Figure 4:
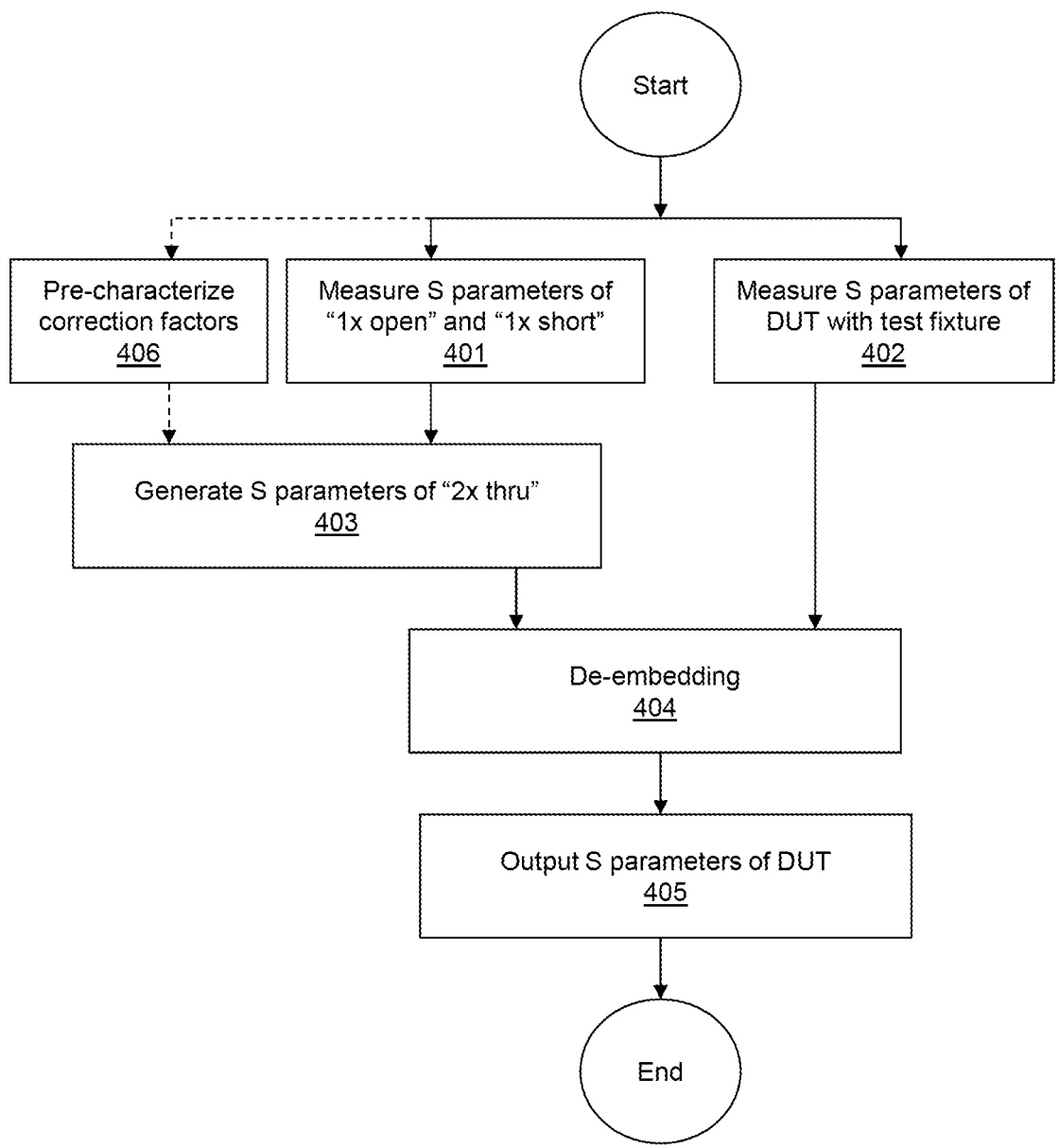
FIG. 4 illustrates a flow chart, in accordance with an example implementation.

FIG. 4 illustrates a flow chart, in accordance with an example implementation. Both "1× open" and "1× short" test structures in FIG. 2 are measured and their S parameters are combined, using the method as described in the summary, to give the S parameters of equivalent "2× thru" test structure in FIG. 3. The S parameters of this equivalent "2× thru" are used subsequently to de-embed the test fixture 103.

At 401, the measurements of the S parameters of the 1× open and 1× short test coupons as shown in FIG. 2 are obtained, which can be done through VNA measurement, through previously obtained touchstone files, and so on, depending on the desired implementation. The electric behavior of the DUT can be processed through algorithms in software by the VNA, or computed in a separate computer, server or other apparatus, depending on the desired implementation to obtain the measurements. At 403, the equivalent S parameter of the 2× thru structure as shown in FIG. 3 can be obtained. At 402, the S parameters of the DUT with test fixture is measured. To measure or extract DUT response, the DUT and the test fixture as illustrated in FIG. 1 is measured together through a connection with the VNA. After the 2× thru S parameters and the S parameter of the test fixture with the DUT are obtained, then de-embedding can be conducted in accordance with the desired implementation at 404, whereupon the S parameters of the DUT can be output at 405. Once the 2× thru S parameters are obtained, they can be applied to derive the de-embedding S parameters and thereby de-embed the test fixture to obtain the S parameters of the DUT. The S parameters of the 2× thru and the DUT with the test fixture can be obtained in any order in accordance with the desired implementation.

As described above, the S parameters of "1× open" ($S_{open}$), can be modified with a correction factor $\Delta_{open}$, to approximate $S_{PMC}$ and the S parameters of "1× short" ($S_{short}$) can be modified with a correction factor $\Delta_{short}$, to approximate $S_{PEC}$ as shown at 406.

The correction factor can be utilized based on the equations as described above, or can also not be utilized depending on the desired implementation. Should a correction factor not be utilized, then the S parameters ($S_{thru}$) is determined from ($S_{open}$) and ($S_{short}$) from the following equations:

$$S_{11} \approx \frac{1}{2}(S_{open} + S_{short})$$

$$S_{12} \approx \frac{1}{2}(S_{open} - S_{short})$$

$$(S_{thru}) = \begin{pmatrix} S_{11} & S_{12} \\ S_{12} & S_{11} \end{pmatrix}$$

wherein the subscript "1" corresponds to a vector of port indices associated with a plurality of external ports of the test fixture.

Figure 5:
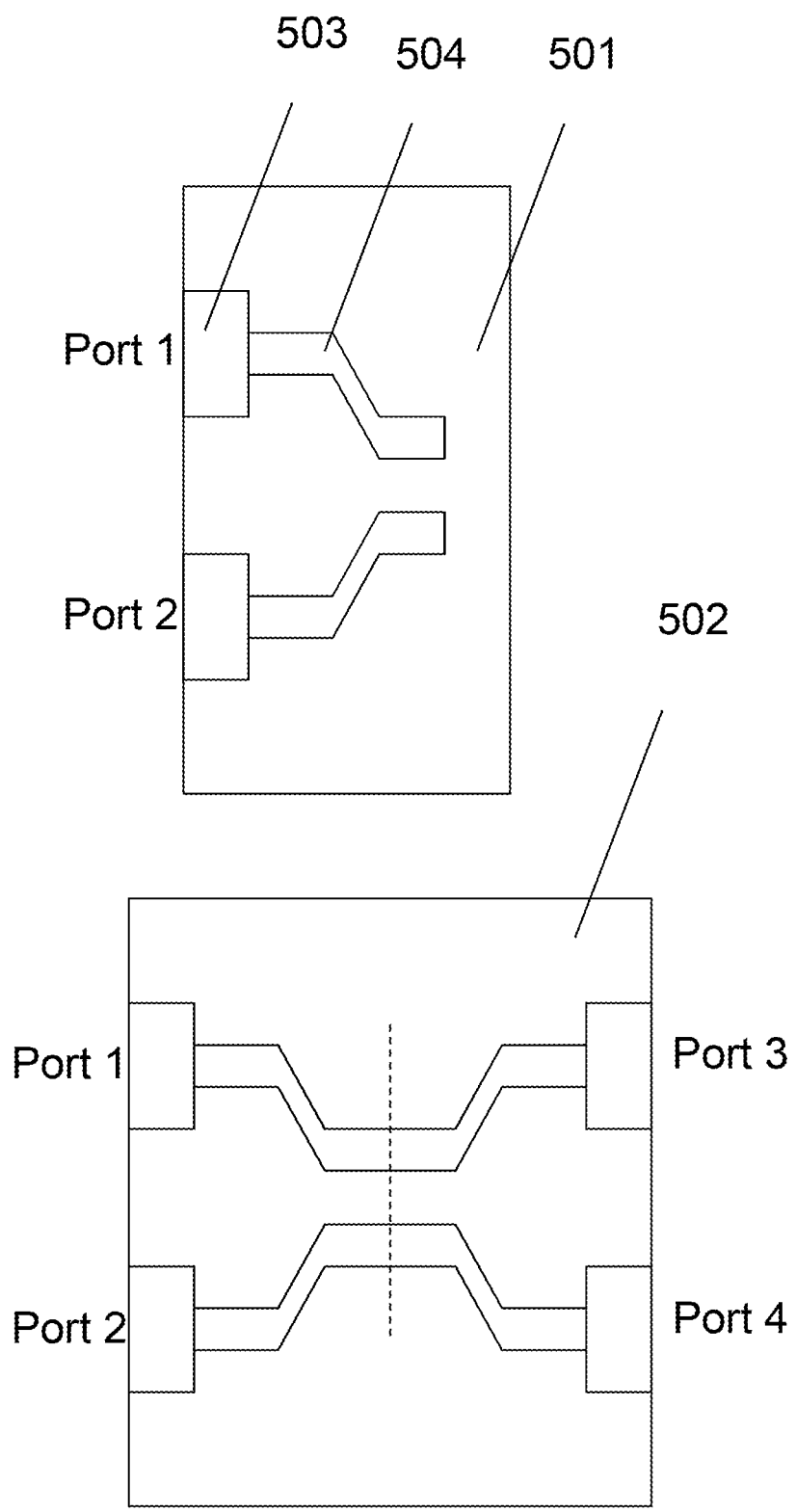
FIG. 5 illustrates the structures of one half of "2× thru" and "2× thru" that are to be simulated, in accordance with an example implementation.

FIG. 5 illustrates the structures of one half of the "2× thru" structure 501 and the full "2× thru" structure 502 that are to be simulated, in accordance with an example implementation. In the example of FIG. 5, the one half of the "2× thru" structure 501 includes microstrip pair 503 and stripline pair 504 arranged in cascade. In an example implementation, microstrip pair 503 is a 0.5" microstrip pair with differential impedance of 117 ohm and effective dielectric constant of 2.7 and stripline pair 504 is a 1.5" stripline pair with differential impedance of 80 ohm and dielectric constant of 3.8. Furthermore, the full "2× thru" structure 502 includes microstrip pair 503, stripline pair 504, and stripline pair 504 and microstrip pair 503 arranged in cascade. In example implementations, the arrangement in cascade includes the placement of each element one after another, which is utilized when processing S parameters.

Figure 6:
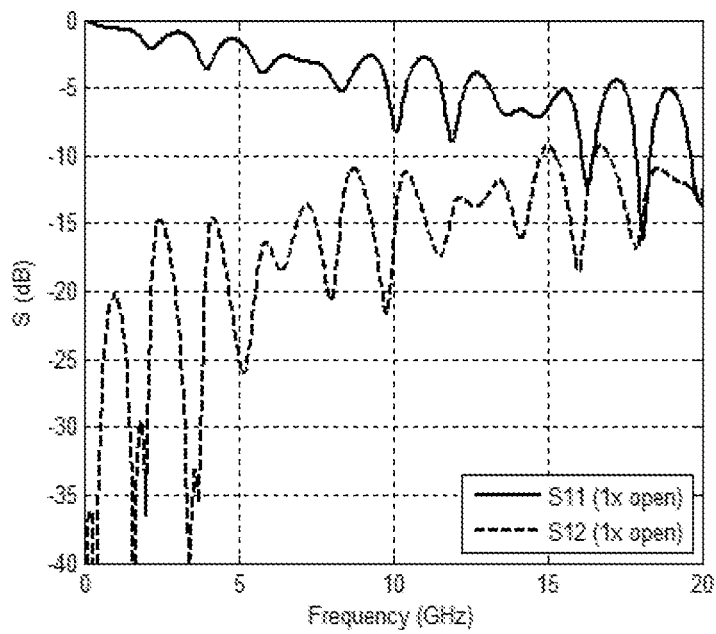
FIG. 6 shows the simulated S parameters of "1× open" and "1× short" corresponding to the "2× thru" structure, in accordance with an example implementation.
Figure 6:
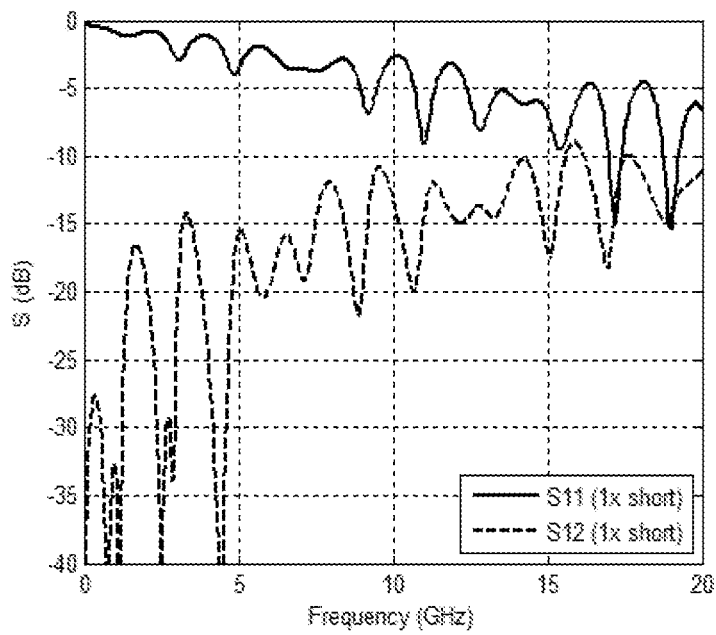

FIG. 6 shows the simulated S parameters of "1× open" and "1× short", in accordance with an example implementation. The example of FIG. 6 illustrates a two port case for 1× open and a two port case for 1× short, where the ports are input/output (I/O) ports on the connections. After the S parameters of "1× open" and "1× short" are combined, the resulting S parameters of the equivalent "2× thru" has four ports. In the example, $S_{11}$ is the reflected signal at port 1 due to the input at port 1 (e.g., effect from reflection), and $S_{12}$ is the response at port 1 due to the input signals at port 2 (e.g., effect from cross-talk). FIG. 6 illustrates the magnitude of S parameters on the ports of the 1× open and 1× short structures, based on this example in FIG. 5.

Figure 7:
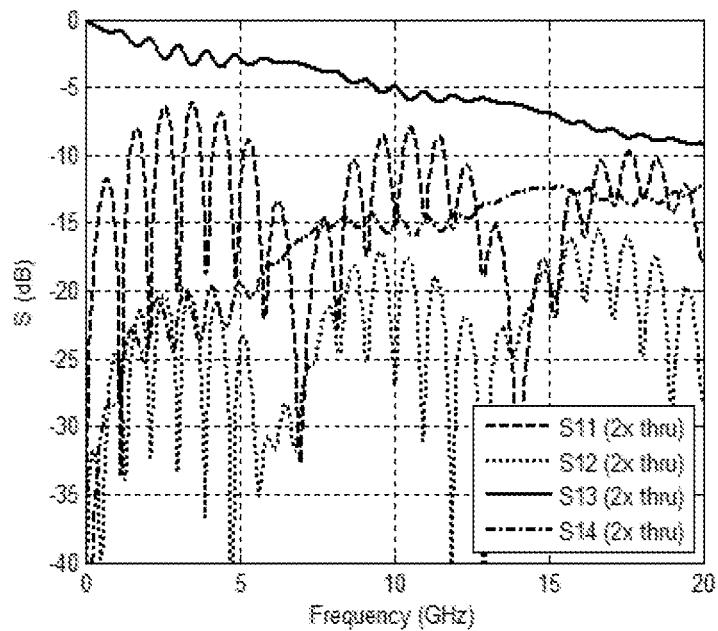
FIG. 7 illustrates the simulated S parameters of the "2× thru" structure, in accordance with an example implementation.

FIG. 7 illustrates the simulated S parameters of the "2× thru" structure, in accordance with an example implementation. Specifically, FIG. 7 illustrates the simulated S parameters of the "2× thru" structure corresponding to the structure of 502 of FIG. 5. Because elements 503 and 504 are modeled by 2D transmission lines, "1× open" is similar to ideal open and "1× short" is similar to ideal short. Using the S parameters of "1× open" and "1× short" in FIG. 6 to reconstruct the S parameters of "2× thru" gives substantially identical results to simulated S parameters of "2× thru" in FIG. 7 in this example.

Figure 8:
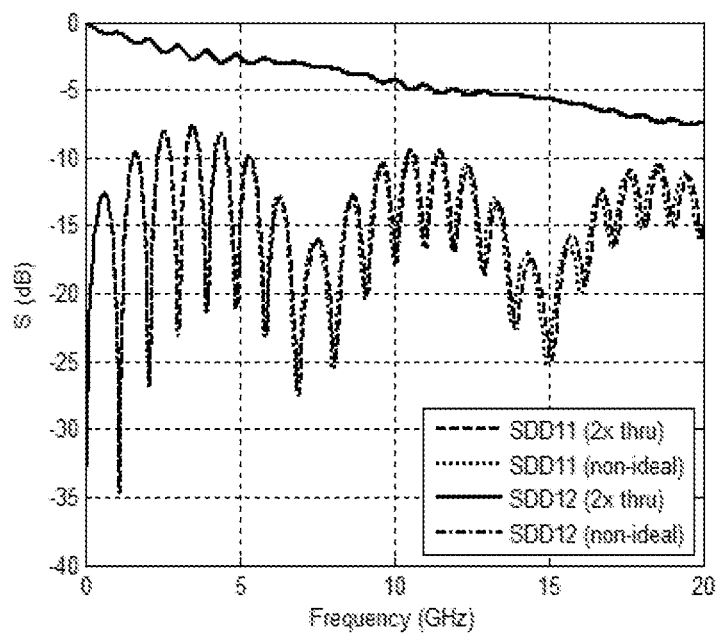
FIG. 8 illustrates the comparison between simulated differential S parameters of the "2× thru" structure in FIG. 7 with the reconstructed differential S parameters of "2× thru" using non-ideal "1× open" and "1× short" test coupons.

FIG. 8 illustrates the comparison between simulated differential S parameters of the "2× thru" structure in FIG. 7 with the reconstructed differential S parameters of "2× thru" using non-ideal "1× open" and "1× short" test coupons. It is assumed in this example that "1× open" sees 50 fF and "1× short" sees 80 pH at the end of each signal conductor. Non-ideal open and short mimic the difference between actual field distribution and PMC and PEC conditions. The error is small in this case.

In FIG. 8, the 1× open may not be a true open circuit, and 1× short may not be a true short circuit. Thus, some slight deviation between the true "2× thru" structure and the non-ideal "2× thru" structure is expected. In FIG. 8, the differential to differential response is plotted, compared to the single-ended response of FIG. 7. However, as shown in FIG. 8, the deviation between non-ideal and true structure is minimal.

Figure 9:
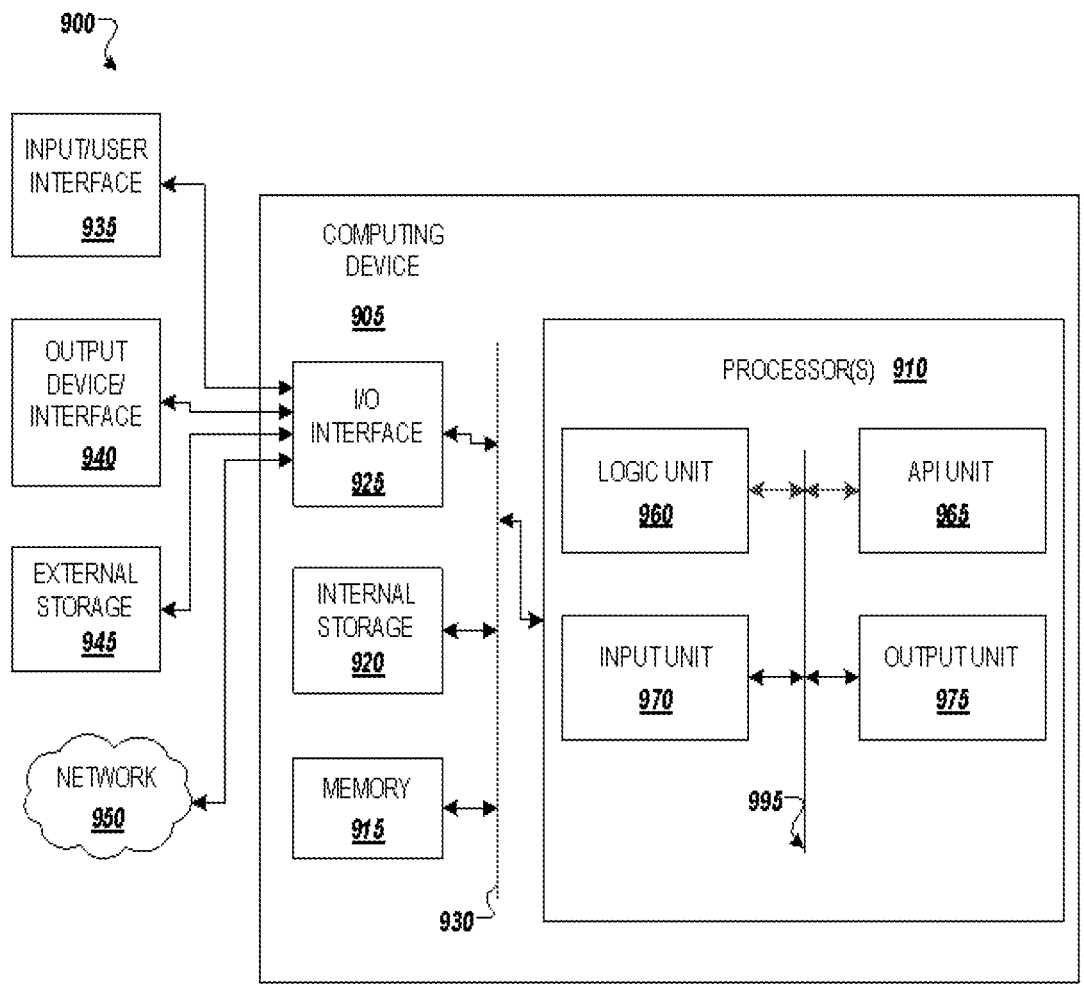
FIG. 9 illustrates an example computing environment with an example computer device suitable for use in example implementations.

FIG. 9 illustrates an example computing environment with an example computer device suitable for use in example implementations. Examples of the computer device can include the VNA, a server, a general purpose computer, and so on, depending on the desired implementation. Computer device 905 in computing environment 900 can include one or more processing units, cores, or processors 910, memory 915 (e.g., RAM, ROM, and/or the like), internal storage 920 (e.g., magnetic, optical, solid state storage, and/or organic), and/or I/O interface 925, any of which can be coupled on a communication mechanism or bus 930 for communicating information or embedded in the computer device 905.

Computer device 905 can be communicatively coupled to input/user interface 935 and output device/interface 940. Either one or both of input/user interface 935 and output device/interface 940 can be a wired or wireless interface and can be detachable. Input/user interface 935 may include any device, component, sensor, or interface, physical or virtual, that can be used to provide input (e.g., buttons, touch-screen interface, keyboard, a pointing/cursor control, microphone, camera, braille, motion sensor, optical reader, and/or the like). Output device/interface 940 may include a display, television, monitor, printer, speaker, braille, or the like. In some example implementations, input/user interface 935 and output device/interface 940 can be embedded with or physically coupled to the computer device 905. In other example implementations, other computer devices may function as or provide the functions of input/user interface 935 and output device/interface 940 for a computer device 905. In example implementations involving a touch screen display, a television display, or any other form of display, the display is configured to provide a user interface.

Examples of computer device 905 may include, but are not limited to, highly mobile devices (e.g., smartphones, devices in vehicles and other machines, devices carried by humans and animals, and the like), mobile devices (e.g., tablets, notebooks, laptops, personal computers, portable televisions, radios, and the like), and devices not designed for mobility (e.g., desktop computers, other computers, information kiosks, televisions with one or more processors embedded therein and/or coupled thereto, radios, and the like).

Computer device 905 can be communicatively coupled (e.g., via I/O interface 925) to external storage 945 and network 950 for communicating with any number of networked components, devices, and systems, including one or more computer devices of the same or different configuration. Computer device 905 or any connected computer device can be functioning as, providing services of, or referred to as a server, client, thin server, general machine, special-purpose machine, or another label.

I/O interface 925 can include, but is not limited to, wired and/or wireless interfaces using any communication or I/O protocols or standards (e.g., Ethernet, 802.11x, Universal System Bus, WiMax, modem, a cellular network protocol, and the like) for communicating information to and/or from at least all the connected components, devices, and network in computing environment 900. Network 950 can be any network or combination of networks (e.g., the Internet, local area network, wide area network, a telephonic network, a cellular network, satellite network, and the like).

Computer device 905 can use and/or communicate using computer-usable or computer-readable media, including transitory media and non-transitory media. Transitory media include transmission media (e.g., metal cables, fiber optics), signals, carrier waves, and the like. Non-transitory media include magnetic media (e.g., disks and tapes), optical media (e.g., CD ROM, digital video disks, Blu-ray disks), solid state media (e.g., RAM, ROM, flash memory, solid-state storage), and other non-volatile storage or memory.

Computer device 905 can be used to implement techniques, methods, applications, processes, or computer-executable instructions in some example computing environments. Computer-executable instructions can be retrieved from transitory media, and stored on and retrieved from non-transitory media. The executable instructions can originate from one or more of any programming, scripting, and machine languages (e.g., C, C++, C#, Java, Visual Basic, Python, Perl, JavaScript, and others).

Memory 915 may be configured to store or manage algorithms to be executed by processor(s) 910 as described in the flow, for example, at FIGS. 1, 3-6 and 8. The example implementations as described herein may be conducted singularly, or in any combination of each other according to the desired implementation and are not limited to a particular example implementation.

Processor(s) 910 can execute under any operating system (OS) (not shown), in a native or virtual environment. One or more applications can be deployed that include logic unit 960, application programming interface (API) unit 965, input unit 970, output unit 975, and inter-unit communication mechanism 995 for the different units to communicate with each other, with the OS, and with other applications (not shown). The described units and elements can be varied in design, function, configuration, or implementation and are not limited to the descriptions provided. Processor(s) 910 can be in the form of physical processors or central processing units (CPU) that is configured to execute instructions loaded from Memory 915.

In some example implementations, when information or an execution instruction is received by API unit 965, it may be communicated to one or more other units (e.g., logic unit 960, input unit 970, output unit 975). In some instances, logic unit 960 may be configured to control the information flow among the units and direct the services provided by API unit 965, input unit 970, output unit 975, in some example implementations described above. For example, the flow of one or more processes or implementations may be controlled by logic unit 960 alone or in conjunction with API unit 965. The input unit 970 may be configured to obtain input for the calculations described in the example implementations, and the output unit 975 may be configured to provide output based on the calculations described in example implementations.

Processor(s) 910 can be configured to determine first S parameters of a device under test (DUT) connected to a test fixture as illustrated in FIG. 1 by utilizing the flow of FIG. 4 as illustrated in the flow at 402. Processor(s) 910 can be further configured to determine second S parameters of a 1× open test structure by utilizing the flow as described in FIG. 4 at 401. Processor(s) 910 can be further configured to determine second S parameters of a 1× open test structure by utilizing the flow as described in FIG. 4 at 401, and third S parameters of a 1× short test structure by utilizing the flow as described in FIG. 4 at 401. Processor(s) 910 can be configured to construct fourth S parameters of a 2× thru test structure from the second S parameters and the third S parameters as shown at the flow of FIG. 4 at 403. Processor(s) 910 can also be configured to de-embed the test fixture based on the first S parameters and the fourth S parameters to generate fifth S parameters of the DUT as shown at the flow of FIG. 4 at 405.

Processor(s) 910 can be configured to construct the fourth S parameters of the 2× thru test structure from the second S parameters and the third S parameters by setting the fourth S parameters corresponding to S parameters of a port directed to itself to be based on a sum of the second S parameters and the third S parameters; and setting the fourth S parameters corresponding to S parameters of a port directed to another port to be based on a difference of the second S parameters and the third S parameters as described in FIGS. 4 through 7. For example, processor(s) 910 can be configured to construct the fourth S parameters ($S_{thru}$) from the second S parameters ($S_{open}$) and the third S parameters ($S_{short}$) in accordance with:

$$S_{11} \approx \frac{1}{2}(S_{open} + S_{short})$$

$$S_{12} \approx \frac{1}{2}(S_{open} - S_{short})$$

$$(S_{thru}) = \begin{pmatrix} S_{11} & S_{12} \\ S_{12} & S_{11} \end{pmatrix}$$

wherein the subscript "1" corresponds to a vector of port indices associated with a plurality of external ports of the test fixture as described in FIGS. 4-7.

Similarly, processor(s) 910 can be configured to determine the second S parameters of the 1× open test structure by applying a correction factor to the second S parameters, wherein the correction factor based on a difference between the 1× open test structure and a perfect magnetic conductor (PMC) boundary condition as described in FIG. 4 at 406. Further, processor(s) 910 can be configured to determine the third S parameters of the 1× short test structure by applying a correction factor to the third S parameters, the correction factor based on a difference between the 1× short test structure and a perfect electric conductor (PEC) boundary condition as described in FIG. 4 at 406. For example, processor(s) 910 can be configured to construct the fourth S parameters ($S_{thru}$) from the second S parameters ($S_{open}$) and the third S parameters ($S_{short}$) in accordance with:

$$S_{11} \approx \frac{1}{2}(S_{open} + S_{short} + \Delta_{open} + \Delta_{short})$$

$$S_{12} \approx \frac{1}{2}(S_{open} - S_{short} + \Delta_{open} - \Delta_{short})$$

and $$(S_{thru}) = \begin{pmatrix} S_{11} & S_{12} \\ S_{12} & S_{11} \end{pmatrix}$$

where the subscript "1" corresponds to a vector of port indices associated with the plurality of external ports of test fixture; and wherein $\Delta_{open}$ is a first correction factor for the second S parameters, and $\Delta_{short}$ is a second correction factor for the third S parameters as described in FIGS. 4-7.

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of defined steps leading to a desired end state or result. In example implementations, the steps carried out require physical manipulations of tangible quantities for achieving a tangible result.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It will be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

Moreover, other implementations of the present application will be apparent to those skilled in the art from consideration of the specification and practice of the teachings of the present application. Various aspects and/or components of the described example implementations may be used singly or in any combination. It is intended that the specification and example implementations be considered as examples only, with the true scope and spirit of the present application being indicated by the following claims.

What is claimed is:

1. A non-transitory computer readable medium, storing instructions for executing a process, the instructions comprising:
   determining first S parameters of a device under test (DUT) connected to a test fixture;
   determining second S parameters of a 1× open test structure;
   determining third S parameters of a 1× short test structure;
   constructing fourth S parameters of a 2× thru test structure from the second S parameters and the third S parameters; and
   de-embedding the test fixture based on the first S parameters and the fourth S parameters to generate fifth S parameters of the DUT.

2. The non-transitory computer readable medium of claim 1, wherein the constructing the fourth S parameters of the 2× thru test structure from the second S parameters and the third S parameters comprises:
   setting the fourth S parameters corresponding to S parameters of a port directed to itself to be based on a sum of the second S parameters and the third S parameters; and
   setting the fourth S parameters corresponding to S parameters of a port directed to another port to be based on a difference of the second S parameters and the third S parameters.

3. The non-transitory computer readable medium of claim 1, wherein the constructing the fourth S parameters ($S_{thru}$) from the second S parameters ($S_{open}$) and the third S parameters ($S_{short}$) is performed in accordance with:

$$S_{11} \approx \frac{1}{2}(S_{open} + S_{short})$$

$$S_{12} \approx \frac{1}{2}(S_{open} - S_{short})$$

$$(S_{thru}) = \begin{pmatrix} S_{11} & S_{12} \\ S_{12} & S_{11} \end{pmatrix}$$

wherein the subscript "1" corresponds to a vector of port indices associated with a plurality of external ports of the test fixture.

4. The non-transitory computer readable medium of claim 1, wherein the determining the second S parameters of the 1× open test structure comprises applying a correction factor to the second S parameters, the correction factor based on a difference between the 1× open test structure and a perfect magnetic conductor (PMC) boundary condition.

5. The non-transitory computer readable medium of claim 1, wherein the determining the third S parameters of the 1× short test structure comprises applying a correction factor to the third S parameters, the correction factor based on a difference between the 1× short test structure and a perfect electric conductor (PEC) boundary condition.

6. The non-transitory computer readable medium of claim 1, wherein the constructing the fourth S parameters ($S_{thru}$) from the second S parameters ($S_{open}$) and the third S parameters ($S_{short}$) is performed in accordance with:

$$S_{11} \approx \frac{1}{2}(S_{open} + S_{short} + \Delta_{open} + \Delta_{short})$$

$$S_{12} \approx \frac{1}{2}(S_{open} - S_{short} + \Delta_{open} - \Delta_{short})$$

and $$(S_{thru}) = \begin{pmatrix} S_{11} & S_{12} \\ S_{12} & S_{11} \end{pmatrix}$$

wherein the subscript "1" corresponds to a vector of port indices associated with the plurality of external ports of test fixture;

wherein $\Delta_{open}$ is a first correction factor for the second S parameters, and $\Delta_{short}$ is a second correction factor for the third S parameters.

7. The non-transitory computer readable medium of claim 6, wherein the first correction factor is based on a difference between the 1× open test structure and a perfect magnetic conductor (PMC) boundary condition and wherein the second correction factor is based on a difference between the 1× short test structure and a perfect electric conductor (PEC) boundary condition.

8. An apparatus, comprising:
a processor, configured to:
determine first S parameters of a device under test (DUT) connected to a test fixture;
determine second S parameters of a 1× open test structure;
determine third S parameters of a 1× short test structure;
construct fourth S parameters of a 2× thru test structure from the second S parameters and the third S parameters; and
de-embed the test fixture based on the first S parameters and the fourth S parameters to generate fifth S parameters of the DUT.

9. The apparatus of claim 8, wherein the processor is configured to construct the fourth S parameters of the 2× thru test structure from the second S parameters and the third S parameters by:
setting the fourth S parameters corresponding to S parameters of a port directed to itself to be based on a sum of the second S parameters and the third S parameters; and
setting the fourth S parameters corresponding to S parameters of a port directed to another port to be based on a difference of the second S parameters and the third S parameters.

10. The apparatus of claim 8, wherein the processor is configured to construct the fourth S parameters ($S_{thru}$) from the second S parameters ($S_{open}$) and the third S parameters ($S_{short}$) in accordance with:

$$S_{11} \approx \frac{1}{2}(S_{open} + S_{short})$$

$$S_{12} \approx \frac{1}{2}(S_{open} - S_{short})$$

$$(S_{thru}) = \begin{pmatrix} S_{11} & S_{12} \\ S_{12} & S_{11} \end{pmatrix}$$

wherein the subscript "1" corresponds to a vector of port indices associated with a plurality of external ports of the test fixture.

11. The apparatus of claim 8, wherein the processor is configured to determine the second S parameters of the 1× open test structure by an application of a correction factor to the second S parameters, the correction factor based on a difference between the 1× open test structure and a perfect magnetic conductor (PMC) boundary condition.

12. The apparatus of claim 8, wherein the processor is configured to determine the third S parameters of the 1× short test structure by an application of a correction factor to the third S parameters, the correction factor based on a difference between the 1× short test structure and a perfect electric conductor (PEC) boundary condition.

13. The apparatus of claim 8, wherein the processor is configured to construct the fourth S parameters ($S_{thru}$) from the second S parameters ($S_{open}$) and the third S parameters ($S_{short}$) is performed in accordance with:

$$S_{11} \approx \frac{1}{2}(S_{open} + S_{short} + \Delta_{open} + \Delta_{short})$$

$$S_{12} \approx \frac{1}{2}(S_{open} - S_{short} + \Delta_{open} - \Delta_{short})$$

and $$(S_{thru}) = \begin{pmatrix} S_{11} & S_{12} \\ S_{12} & S_{11} \end{pmatrix}$$

where the subscript "1" corresponds to a vector of port indices associated with the plurality of external ports of test fixture;

wherein $\Delta_{open}$ is a first correction factor for the second S parameters, and $\Delta_{short}$ is a second correction factor for the third S parameters.

14. The apparatus of claim 13, wherein the first correction factor is based on a difference between the 1× open test structure and a perfect magnetic conductor (PMC) boundary condition and wherein the second correction factor is based on a difference between the 1× short test structure and a perfect electric conductor (PEC) boundary condition.

15. A system for de-embedding the test fixture and extracting the S parameters of device under test (DUT) comprising:
- a DUT and test fixture assembly connected to a first apparatus configured to produce first S parameters;
- a calibration board comprising a 1× open test structure and a 1× short test structure;
- a second apparatus configured to combine second S parameters of the 1× open test structure and third S parameters of the 1× short test structure to construct fourth S parameters of a 2× thru test structure; and
- an extractor configured to de-embed the test fixture by using the fourth S parameters to generate fifth S parameters of the DUT.

16. The system of claim 15, wherein the second apparatus is configured to construct the fourth S parameters ($S_{thru}$) from the combination of the second S parameters ($S_{open}$) and the third S parameters ($S_{short}$) in accordance with:

$$S_{11} \approx \frac{1}{2}(S_{open} + S_{short})$$

$$S_{12} \approx \frac{1}{2}(S_{open} - S_{short})$$

$$(S_{thru}) = \begin{pmatrix} S_{11} & S_{12} \\ S_{12} & S_{11} \end{pmatrix}$$

wherein the subscript "1" corresponds to a vector of port indices associated with a plurality of external ports of the test fixture.

17. The system of claim 15, wherein the second apparatus is configured to construct the fourth S parameters ($S_{thru}$) from the second S parameters ($S_{open}$) and the third S parameters ($S_{short}$) is performed in accordance with:

$$S_{11} \approx \frac{1}{2}(S_{open} + S_{short} + \Delta_{open} + \Delta_{short})$$

$$S_{12} \approx \frac{1}{2}(S_{open} - S_{short} + \Delta_{open} - \Delta_{short})$$

and $$(S_{thru}) = \begin{pmatrix} S_{11} & S_{12} \\ S_{12} & S_{11} \end{pmatrix}$$

wherein the subscript "1" corresponds to a vector of port indices associated with the plurality of external ports of test fixture;
wherein $\Delta_{open}$ is a first correction factor for the second S parameters, and $\Delta_{short}$ is a second correction factor for the third S parameters.

18. The system of claim 17, wherein the first correction factor $\Delta_{open}$ is based on a difference between "1× open" and perfect magnetic conductor (PMC) boundary condition and wherein the second correction factor $\Delta_{short}$ is based on a difference between "1× short" and perfect electric conductor (PEC) boundary condition, respectively.

19. The system of claim 15, wherein the first apparatus is a vector network analyzer (VNA), and wherein the second apparatus is one of a computer, a server, and the VNA.

20. The system of claim 15, wherein the 1× open test structure and the 1× short test structure are manufactured with substantially similar materials and a substantially similar layout pattern as the test fixture.

* * * * *